United States Patent
Hung et al.

(10) Patent No.: US 6,616,758 B2
(45) Date of Patent: Sep. 9, 2003

(54) METHOD AND APPARATUS FOR SPIN COATING

(75) Inventors: Ching-Chang Alex Hung, Singapore (SG); Lotar Peter Mahneke, Buchholz (DE); Ying-Yi Chen, Taipei (TW)

(73) Assignee: Techpoint Pacific (S) PTE LTD, Singapore (SG)

( * ) Notice: Subject to any disclaimer, the term of this patent is extended or adjusted under 35 U.S.C. 154(b) by 0 days.

(21) Appl. No.: 09/886,523

(22) Filed: Jun. 20, 2001

(65) Prior Publication Data
US 2002/0136828 A1 Sep. 26, 2002

(30) Foreign Application Priority Data
Mar. 23, 2001 (SG) ............................. 200101843

(51) Int. Cl.<sup>7</sup> ............................................... B05C 11/02
(52) U.S. Cl. ........................... 118/52; 118/50; 118/326; 427/240
(58) Field of Search ................. 118/52, 50, 326; 427/240

(56) References Cited

U.S. PATENT DOCUMENTS

| | | | | |
|---|---|---|---|---|
| 5,374,312 A | * | 12/1994 | Hasebe et al. | 118/52 |
| 5,688,322 A | * | 11/1997 | Motoda et al. | 118/52 |
| 5,885,353 A | * | 3/1999 | Strodtbeck et al. | 118/56 |
| 6,068,881 A | * | 5/2000 | Valley et al. | 427/240 |
| 6,207,231 B1 | * | 3/2001 | Tateyama | 427/240 |
| 6,361,600 B1 | * | 3/2002 | Tateyama et al. | 118/56 |

* cited by examiner

Primary Examiner—J. A. Lorengo
Assistant Examiner—Michelle A Lazor
(74) Attorney, Agent, or Firm—Liu & Liu

(57) ABSTRACT

A rotatable cover plate assembly (10) has a cavity (13) and a rotatable base plate assembly (12) has a cavity (42) with a semiconductor wafer (14) mounted therein. The cover plate assembly (10) comes down onto the base plate assembly (12) enclosing the semiconductor wafer (14) and a dispenser (28) in a chamber formed by the cavities (13) and (42). The cover and base plates (16) and (40) are rotated as a single assembly, and coating material dispensed by the dispenser (28) onto the semiconductor wafer (14). A flow regulator (25) coupled via an exhaust manifold (20) controls the rate of evaporate of solvent from the dispensed coating material.

13 Claims, 4 Drawing Sheets

METHOD AND APPARATUS FOR SPIN COATING

FIELD OF THE INVENTION

The present invention relates to spin coating and more particularly to spin coating of chemicals in a controllable environment.

BACKGROUND OF THE INVENTION

Spin coating is a known process for forming a layer of dispensed material on a rotating surface using the centrifugal force on the dispensed material. Typically, a substrate or a semiconductor wafer is held in chuck with a surface to be coated in a horizontal orientation. The chuck then spins causing the surface to be coated to rotate at a predetermined speed, and a dispenser then dispenses a predetermined amount of coating material in liquid form close to center of the rotation.

The rotation imposes a centrifugal force on the coating material which forces the mass of coating material to be pushed outwards away from the center of rotation towards the edges of the surface to be coated. As the coating material moves from the center to the edges, some of the coating material adheres to the surface and some of the coating material continues to flow outwards. In this way, a layer of coating material is formed over the surface to be coated. Excess coating material is either thrown off the edges or form a bead along the edges.

Spin coating is employed in a variety of applications such as forming photomasks and micromachining. Forming photomasks, for example, comprises the step of forming a layer of photoresist on a semiconductor wafer as part of a photolitographic process that forms circuit elements and components on the wafer. Spin coating is also used to form a layer of material on glass, forming a layer of dielectric material, and forming a layer of low-K material.

It is desirous that the layer of coating material formed by spin coating have a uniform thickness over the surface on which the coating material is applied. In addition, as coating material can be costly, the spin process should use only sufficient quantities of coating material as is necessary to form a layer with minimal wastage.

Presently, a spin coating apparatus comprises a two piece housing, the upper and lower pieces coming together to form an internal chamber. In the lower piece a chuck holds a work piece securely. For example, the chuck holds a semiconductor wafer. A quantity of coating material is then disposed at the center portion of the wafer, and the upper and lower housing pieces brought together enclosing the wafer and the coating material in the internal chamber. The chuck then rotates the wafer at a predetermined speed until the coating material has formed a uniform layer of coating material on the wafer.

The coating material contains solvent which begins to evaporate as soon as the coating material is dispensed. Using the conventional spin coating apparatus described above, during the time between dispensing the coating material and bringing the upper and lower housing pieces together, considerable quantities of solvent can evaporate. The lower the solvent content of the coating material, the lower the viscosity of the coating material. And, the lower the viscosity of the coating material the more difficult it is to spread the coating material evenly. Thus, resulting in a poorly formed layer of coating material, where the thickness of the coating material is not uniform. Non-uniform layers of coating material are not acceptable in a variety of subsequent processes. For example, when a layer of photoresist is not uniformly formed, the subsequent photolitographic processes result in inaccurately formed circuit elements and components.

Hence, one disadvantage of the known spin coating process is the time that lapses between dispensing coating material before the rotation is started. Another disadvantage is the lack of control of evaporation of the solvent from the coating material.

BRIEF SUMMARY OF THE INVENTION

The present invention seeks to provide a method and apparatus for spin coating which overcomes, or at least reduces the above-mentioned problems of the prior art.

Accordingly, in one aspect, the present invention provides an apparatus for spin coating, the apparatus comprising:
a cover plate assembly comprising:
  a rotatable cover plate having a first cavity, and the rotatable cover plate having at least one vent gaseously coupled to the first cavity; and
a base plate assembly for removably coupling to the cover plate assembly, the base plate assembly comprising:
  a rotatable base plate having a second cavity, wherein the rotatable base plate includes a mount for securing a work piece in the second cavity,
wherein when the cover plate assembly and the base plate assembly come together, the rotatable cover plate couples to the rotatable base plate and the first cavity and the second cavity form a rotatable chamber with the work piece enclosed therein.

In another aspect, the present invention provides an apparatus for spin coating, the apparatus comprising:
a cover plate assembly comprising:
  a rotatable cover plate having a first cavity and an opening gaseously coupled to the first cavity;
  a manifold having an inlet coupled to the opening of the rotatable cover plate and having an outlet, wherein the outlet of the manifold is gaseously coupled to the first cavity through the opening, and wherein the manifold comprises a fluid controller for varying the degree of gaseous coupling between the first cavity and the outlet of the manifold; and
  a coating material dispenser extending into the first cavity; and
a base plate assembly for removably coupling to the cover plate assembly, the base plate assembly comprising:
  a rotatable base plate having a second cavity, wherein the rotatable base plate includes a mount for securing a work piece in the second cavity,
wherein when the cover plate assembly and the base plate assembly come together, the rotatable cover plate couples to the rotatable base plate and the first cavity and the second cavity form a rotatable chamber with the work piece enclosed therein.

In yet another aspect, the present invention provides a method for spin coating, the method comprising the steps of:
a) providing:
  a cover plate assembly comprising:
    a rotatable cover plate having a first cavity, and the first cavity having at least one vent gaseously coupled to the first cavity; and
  a base plate assembly for removably coupling to the cover plate assembly, the base plate assembly comprising:

a rotatable base plate having a second cavity, wherein the rotatable base plate includes a mount for securing a work piece in the second cavity, a work piece having at least one surface for spin coating; and coating material;

b) determining speed of rotation, duration of rotation and quantity of the coating material to dispense from composition of the coating material, size of the vent, and desired thickness of the coating material to be formed on the at least one surface of the work piece;

c) mounting the work piece in the second cavity of the rotatable base plate;

d) securing the cover plate assembly and the base plate assembly together such that the rotatable cover plate couples to the rotatable base plate and the first cavity and the second cavity form a rotatable chamber with the work piece enclosed therein;

e) dispensing at least some of the quantity of coating material determined in step (b) on the at least one surface; and f) rotating the cover plate assembly and the base plate assembly at the speed of rotation for the duration of rotation determined in step (b), thereby spreading the at least some of the quantity of coating material on the at least one surface to form a layer of coating material having the desired thickness.

BRIEF DESCRIPTION OF THE DRAWINGS

An embodiment of the present invention will now be more fully described, by way of example, with reference to the drawings of which.

DETAIL DESCRIPTION OF THE DRAWINGS

The present invention, as will be described below, is a spin coating apparatus that encloses a semiconductor wafer in a chamber and advantageously dispenses coating material on the semiconductor wafer after the semiconductor wafer has been enclosed in the chamber. In addition, the spin coating apparatus provides a means of controlling the evaporation of the solvent in the coating material within the chamber. Thus, providing improved control over the spreading of the coating material on the semiconductor wafer.

Figure 1:
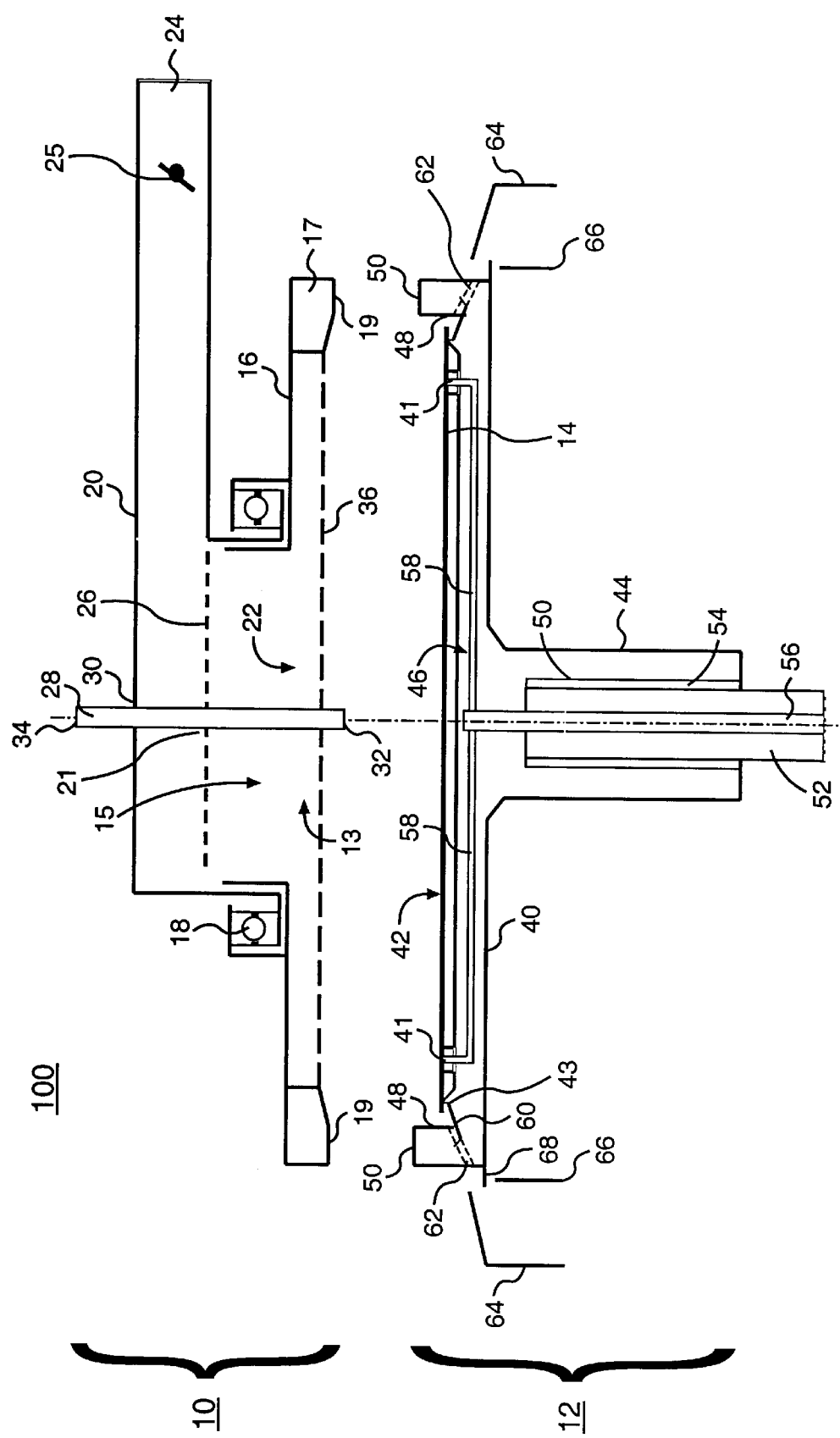
FIG. 1 shows side sectional view of a spin coating apparatus in accordance with the present invention.

In FIG. 1 a spin coating apparatus 100 is shown in an open position where a top plate assembly 10 is raised upwards away from a base plate assembly 12. In the open position, a semiconductor wafer or substrate 14 is positioned in the base plate assembly 12 prior to spin coating.

The top plate assembly 10 includes a cover plate 16, which is coupled via a cover plate bearing 18 to an exhaust manifold 20 having an internal passage 21. The cover plate 16 is circular with a downwardly extending side wall 17 along its perimeter which together form a cavity 13. A central opening 15 extends from the cavity 13 through the bearing 18. In addition, the sidewall 17 has a coupling edge 19.

Gaseous combination of air and solvent vapor from dispensed coating material passes through the central opening 15 and the internal passage 21. As the velocity of these gaseous combination flows, a low pressure is created on the out side of the top plate assembly 10. This causes ambient air on the out side of the top plate assembly 10 to be sucked through the bearing 18, and through the gap between exhaust manifold 20 and the cover plate 16. Hence, the bearing 18 is advantageously not exposed to the solvent vapor.

The exhaust manifold 20 includes an inlet 22 and an outlet 24, with a flow regulator 25, comprising a butterfly valve, mounted in the internal passage 21, closer to the outlet 24. The inlet 22 is coupled through the bearing 18 to the central opening 15 of the cover plate 16, where the inlet 22 together with the exhaust manifold provides a vent. Close to the inlet 22 of the exhaust manifold 20, an exhaust barrier plate 26 extends across the internal passage 21. The exhaust barrier plate 26 reduces the effects of turbulence and the flow back or back stream of particles. The exhaust barrier plate 26 comprises a perforated metal plate, with the perforations being of equal size and being evenly distributed.

The outlet 24 of the exhaust manifold 20 can be coupled to a vacuum pump (not shown) to enhance the flow of solvent vapor, and thereby speed up the drying process of the coating material, as will be apparent later in the description that follows. Hence, thicker layers of coating material can advantageously be dried in a relatively short time when a vacuum is employed.

Figure 4:
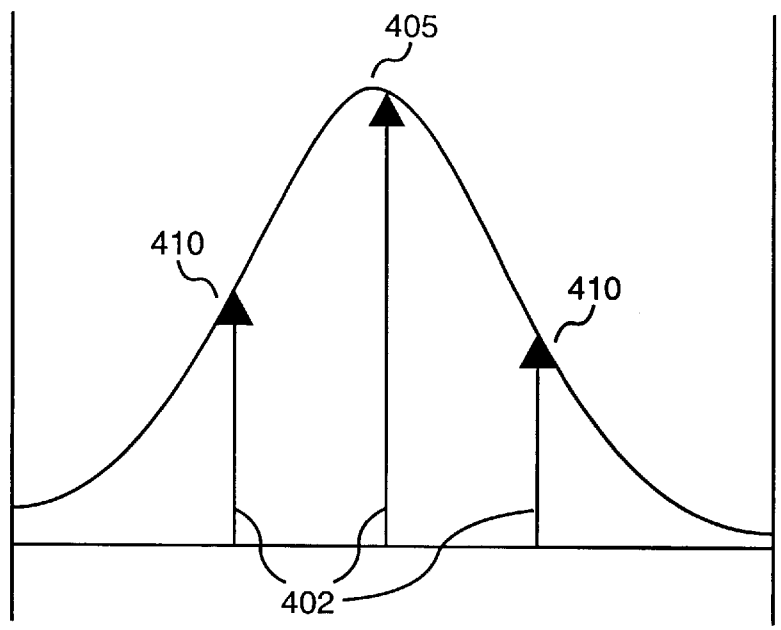
FIG. 4 shows a side sectional view of the inner passage without a barrier plate and indicating air velocity therethrough.

With reference now to FIG. 4, the distribution of air velocity in the internal passage of an exhaust manifold without the exhaust barrier plate 26, indicates that the air velocity is higher near a central portion 405 of the inner passage, and is lower at portions 410 closer the inner walls of the inner passage. This is indicated graphically by arrows 402 with the longer arrows representing higher velocity and the shorter arrows representing lower velocity. It has been found that this uneven distribution of air velocity in the inner passage can cause turbulence and the flow back of particles, which have a detrimental effect on the resultant coating that is formed.

Figure 5:
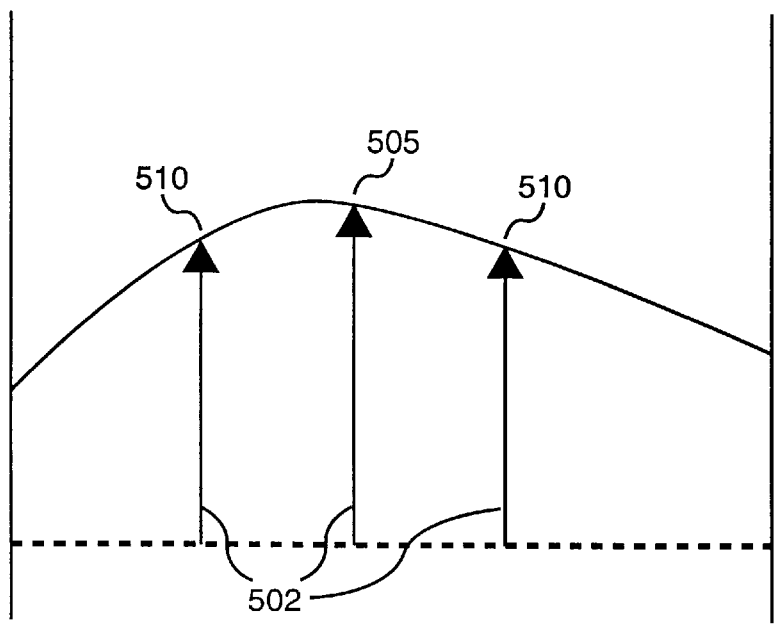
FIG. 5 shows a side sectional view of the inner passage with the barrier plate and indicating air velocity therethrough.

Referring to FIG. 5, distribution of the air velocity with the exhaust barrier plate 26 extending across the inner passage evens out the distribution of the air velocity to become more uniform between central portion 505 of the inner passage, and portions 510 closer to the inner walls. This is indicated graphically by arrows 502. Consequently, the more evenly distributed air velocity reduces turbulence and the flow back of particles.

Returning now to FIG. 1, a dispense nozzle 28 extends vertically through an opening 30 in the exhaust manifold 20. A dispense end 32 of the dispense nozzle 28 extends towards the center of the base plate assembly 12, when the top plate assembly 10 is positioned on the base plate assembly 12, while supply end 34 of the dispense nozzle 28 is coupled to a supply of coating material (not shown). A second dispense nozzle (not shown) may be employed to dispense a solvent prior to the dispense of the coating material. Dispensing the solvent, which is the same solvent as is contained in the coating material, in a chamber formed by the top plate assembly 10 and the base plate assembly 12, which will be described later, saturates the chamber with solvent vapor before the coating material is dispensed. This prevents or at least reduces the evaporation of solvent in the coating material, thereby reducing change in the viscosity of the dispensed coating material.

The dispense end 32 extends through an exhaust distribution plate 36 that is mounted within the sidewall 17 of the cover plate 16. The exhaust distribution plate 36 makes the exhaust uniform over the semiconductor wafer 14. This is accomplished in a similar way as explained earlier with reference to FIGS. 4 and 5.

The base plate assembly 12 comprises a base plate 40 having top and bottom sides. The base plate 40 has cavity 42 on the topside and a spindle 44 extending from the bottom side. The cavity 42 is formed by a base 46 of the base plate 40, and side wall 48 that extend around the perimeter of the base 46. The base plate 40 has vacuum ports 41 and a barrier ring 43 that holds the semiconductor wafer 14 securely to the base plate 40, thus forming a mount for the semiconductor wafer 14.

The sidewall 48 is at right angles, and may also be inclined inwardly relative to the base 46, and the sidewall 48 has a coupling edge 50 for engaging with the coupling edge 19 on the cover plate 16. The height of the side wall 48 is greater than the height of the semiconductor wafer 14 when mounted on the barrier ring 43 to ensure sufficient clearance between the semiconductor wafer 14 and the top plate assembly 10, when the top plate assembly 10 and the base plate assembly 12 are brought together.

The spindle 44 is a partially hollow forming a tubular section 50. A drive shaft 52 fits into the tubular section 50, with a plastic insert 54 held between the inside surface of the tubular section 50 and the outside surface of the drive shaft 52. The drive shaft 52 has a vacuum pathway 56 through its length. The vacuum pathway 56 couples to a vacuum pathway 58 in the base plate 40 and distribution vacuum pathways extend and couple to the vacuum ports 41.

The outer side 60 of the base barrier ring 43 slopes downward until it meets the side wall 48. At various locations along where the outer side slope 60 meets the side wall 48, drain holes 62 extend downwardly through the side wall 48. The outer side slope 60 and the drain holes 62 are for draining excess coating material that is thrown off the semiconductor wafer 14. The excess coating material flows down the outer side slope 60 and out through the drain holes 62.

External to the base plate assembly 12, is an outer catch cup 64 that surrounds the base plate assembly 12. Proximal to the catch cup 64 is a leak barrier 66. Together, the arrangement of the catch cup 64 and the leak barrier direct 66 excess coating material expelled from the drain holes to a storage section (not shown). A guide ring 68 that extends from the lower edge of the base plate 40 between the upper edges of the catch cup 64 and the leak barrier 66 guides the excess coating material between the upper edges of the catch cup 64 and the leak barrier 66.

Figure 2:
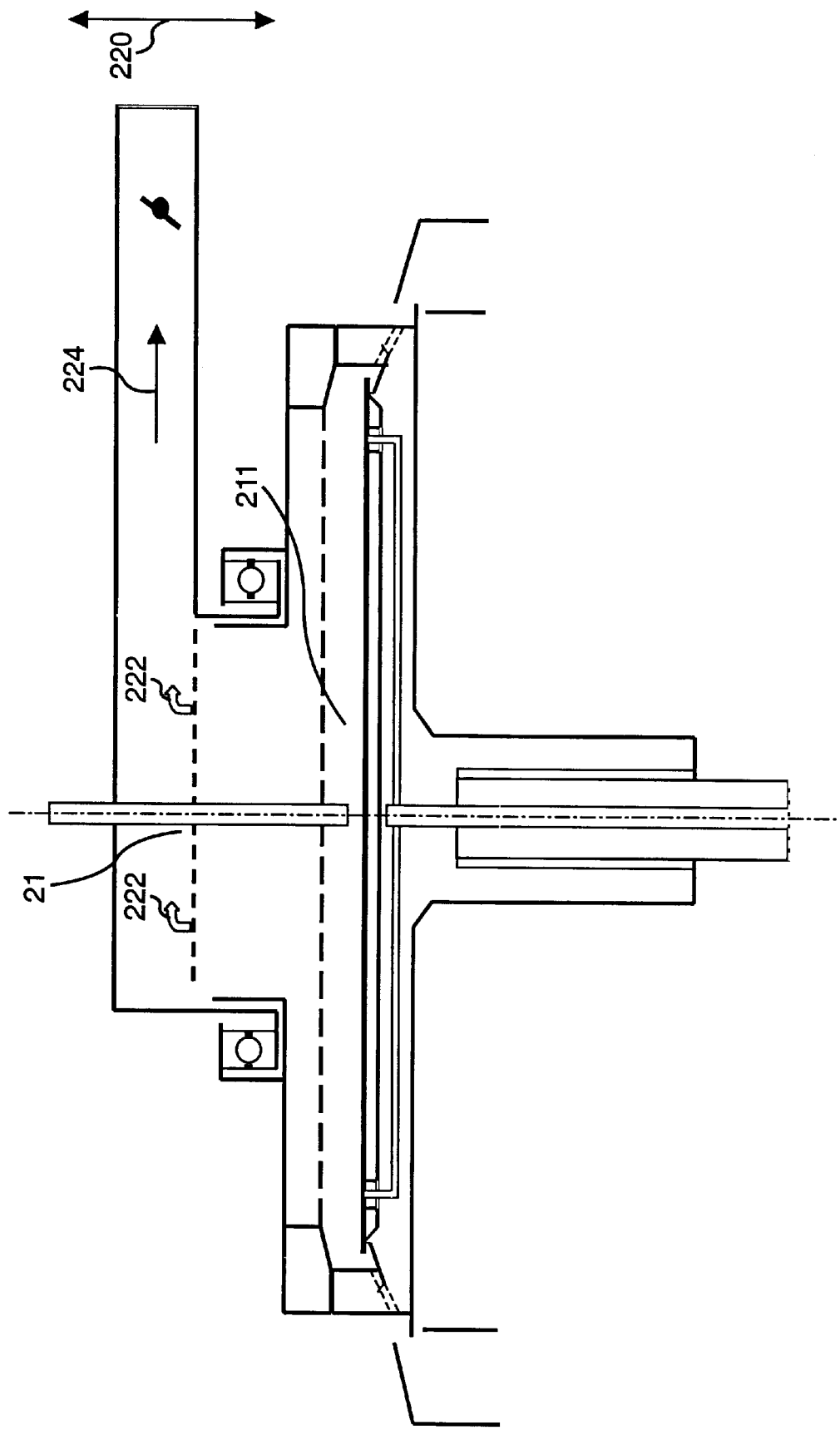
FIG. 2 shows a side sectional view of the spin coating apparatus in FIG. 1 in another process position.

With additional reference to FIG. 2, the spin coating apparatus 100 is now shown in a closed position, where the top plate assembly 10 is on the base plate assembly 12. The arrow 220 indicates the vertical movement of the top plate assembly 10.

The coupling edge 19 on the side wall 17 of the cover plate 16 engages the coupling edge 50 on the side wall 48 of the base plate 40. In the closed position, the semiconductor wafer or substrate 14 is enclosed in a chamber 211 which is formed by the two cavities 13 and 42. External pressure may be applied to keep the cover plate 16 and the base plate 40 held together.

Coating material is dispensed on the semiconductor wafer 14 when the semiconductor wafer 14 is enclosed in the chamber 211 and after the flow regulator 25 is closed. After the coating material is dispensed, the inside of the chamber 211 between the semiconductor wafer 14 and the cover plate 16 fills with solvent vapor given off from the coating material. The solvent vapor contained in the chamber maintains the change of viscosity of the dispensed coating material to a minimum. It is important that the volume of the chamber 211 be made as small as possible in order to minimize any resultant change in viscosity that may occur. In effect, the chamber 211, with the flow regulator 25 closed, reduces the rate at which solvent dries out of the dispensed coating material.

The setting of the flow regulator 25 controls the rate at which solvent vapor evaporates from the dispensed coating material, through the exhaust distribution plate 36 and the exhaust barrier plate 26, along the internal passage 21, pass the flow regulator 25, and out through the outlet 24 to the ambient environment. Arrows 222 and 224 indicate the flow of the solvent vapor.

Figure 3:
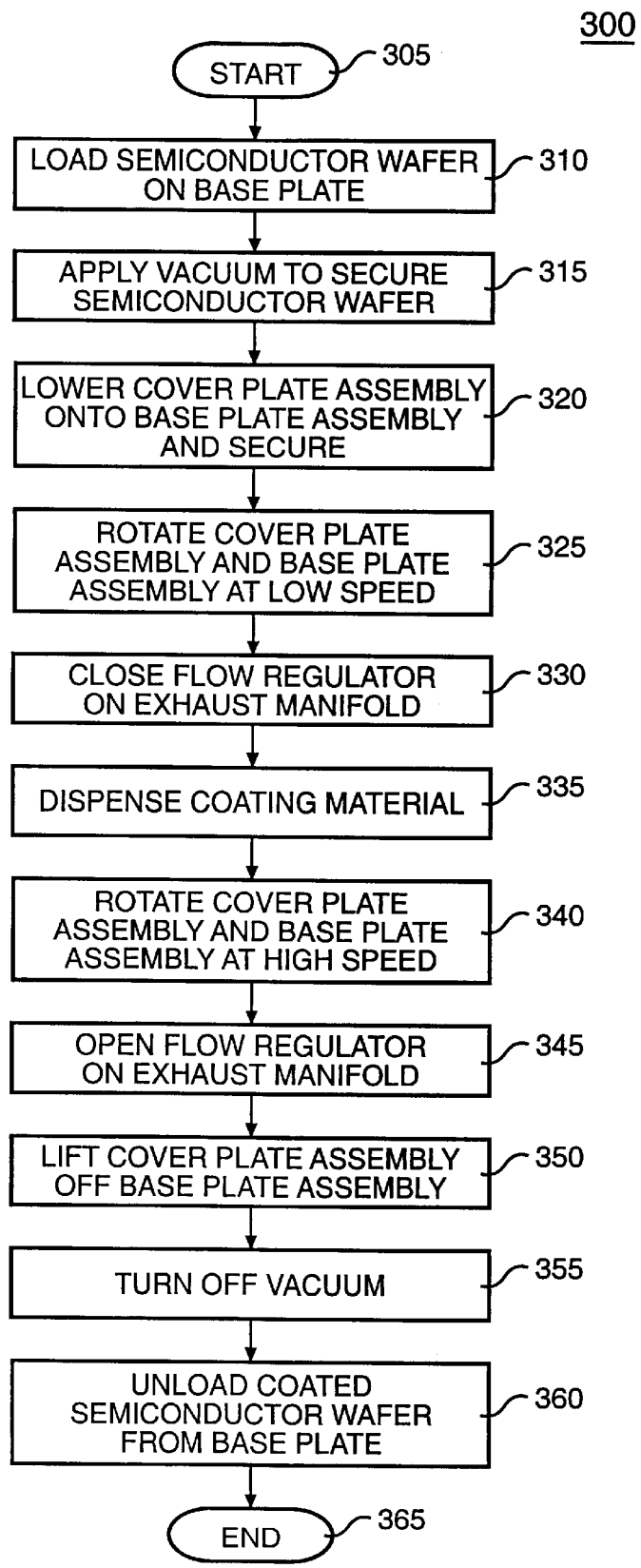
FIG. 3 shows a flow chart detailing operation of the spin coating apparatus in FIG. 1.

With additional reference to FIG. 3, the process 300 detailing the operation of the spin coating apparatus 100 starts 305 with the top plate assembly 10 and the base plate assembly 12 in the open position, when a semiconductor wafer 14 to be coated with coating material is loaded 310 on the barrier ring 43 on the base plate 40. Vacuum is then applied 315 to the vacuum ports 41 to secure the semiconductor wafer 14 to the base plate 40.

Next, the cover plate assembly 10 is lowered 320 onto the base plate assembly 12 and the cover plate 16 is fixed into position and secured to the base plate 40 with pins (not shown). The top plate assembly 10 and the base plate assembly 12 is then rotated 325 at a predetermined low speed, and the flow regulator 25 is closed 330.

The dispenser 28 dispenses 335 coating material onto the semiconductor wafer 14 while the semiconductor wafer 14 is rotating at the low speed. This is known as dynamic dispense of coating material, and when this happens the space within the chamber 211 fills with solvent vapor from the dispensed coating material.

The contained solvent vapor advantageously reduces the change of viscosity of the dispensed coating material, thus, allowing the dispensed coating material to be spread across the surface of the semiconductor wafer 14 more evenly.

After spreading the dispensed coating material, the top plate assembly 16 and the base plate assembly 40 are rotated 340 at a higher speed to form a layer of the coating material with a desired thickness. The resulting thickness is a function of the speed of rotation, the composition of the coating material and the resulting characteristics, such as, viscosity, solid content, surface tension, and duration of rotation.

The layer of coating material now needs to be dried out, and the flow regulator 25 is opened 345. Subsequently, the top plate assembly 10 is lifted 350 off the base plate assembly 12 while the base plate assembly 12 is still spinning. This aids and speeds up the drying process of the coating material as the coating material is exposed to the ambient air. After the rotation of the base plate has stopped, the vacuum to the vacuum ports 41 is turned off 355, and the coated semiconductor wafer 14 is unloaded from the base plate 4, thus ending 365 the process 300.

The present invention, as described, provides a spin coating apparatus that advantageously supports dynamic dispensing of coating material and control of the evaporation of solvent from the dispensed coating material.

This is accomplished by enclosing a coating dispenser in a rotatable chamber formed by two cavities. A cavity in a rotatable cover plate and a cavity in a rotatable base plate. In an open position the two plates are separated and a work piece is loaded and held on a mount in the base plate. The plates are then closed sealing the work piece in the chamber. The two plates are rotated and the dispenser disposes coating material on the rotating work piece. A flow controller comprising a variable sized vent on the cover plate is closed when the coating material is dispensed. After the coating material has spread across a surface of the work piece, the speed of rotation is raised, and after the coating material has a desired thickness the variable vent is opened to dry out the coating material. The two plates are then separated to remove the coated work piece.

The present invention therefore provides a method and apparatus for spin coating which overcomes, or at least reduces the abovementioned problems of the prior art.

It will be appreciated that although only one particular embodiment of the invention has been described in detail, various modifications and improvements can be made by a person skilled in the art without departing from the scope of the present invention.

What is claim is:

1. An apparatus for spin coating, the apparatus comprising:
    a dispenser for dispensing a liquid onto the surface of the work piece,
    a cover plate assembly comprising:
        a rotatable cover plate having a first cavity, the rotatable cover plate having at least one vent gaseously coupled to the first cavity. The vent including a exhaust manifold;
        coupled to the cover plate for controlling the rate at which the gaseous component evaporates from the dispensed liquid; and
        a base plate assembly for removably coupling to the cover plate assembly, the base plate assembly comprising:
            a rotatable base plate having a second cavity, and a mount for securing a work piece in the second cavity,
            wherein when the cover plate assembly and the base plate assembly come together, the rotatable cover plate couples to the rotatable base plate so that the first cavity and the second cavity form a rotatable chamber with the work piece enclosed therein, and the first cavity is positioned above the work piece in a manner that enables the gaseous component from the dispensed liquid to pass through the first cavity and subsequently through the at least one vent.

2. An apparatus in accordance with claim 1 wherein the at least one vent comprises a centrally located opening in the rotatable cover plate, and the exhaust manifold is rotatably coupled to the centrally located opening.

3. An apparatus in accordance with claim 2 wherein a bearing couples the rotatable cover plate and the exhaust manifold.

4. An apparatus in accordance with claim 3 wherein the bearing comprises a ventilated bearing.

5. An in accordance with claim 1 wherein the at least one vent further comprises at least one perforated member extending across the centrally located opening.

6. An apparatus in accordance with claim 5 wherein the dispenser extends in the at least one vent.

7. An apparatus in accordance with claim 1 wherein the inner passage of the exhaust manifold further comprises at least one perforated member extending there across.

8. An apparatus in accordance with claim 1 wherein the rotatable cover plate comprises at least one perforated member extending across the cavity.

9. An in accordance with claim 8 wherein the dispenser extends in the at least one vent.

10. An apparatus in accordance with claim 1 wherein the rotatable base plate comprises at least one vent gaseously coupled to the second cavity.

11. An apparatus in accordance with claim 1 wherein the dispenser extends in the at least one vent.

12. An apparatus in accordance with claim 1 wherein the dispenser being adapted for dispensing solvent and coating material in the chamber.

13. An apparatus for spin coating, the apparatus comprising:
    a cover plate assembly comprising:
        a rotatable cover plate having a first cavity and an opening gaseously coupled to the first cavity;
        a dispenser extending into the first cavity for dispensing a coating liquid onto a work piece;
        an exhaust manifold having an inlet coupled to the opening of the rotatable cover plate and having an outlet, wherein the outlet of the manifold is gaseously coupled to the first cavity through the opening, and wherein the exhaust manifold comprises a fluid controller for controlling the rate at which the gaseous component evaporates from the dispensed coating liquid; and
    a base plate assembly for removably coupling to the cover plate assembly, the base plate assembly comprising:
        a rotatable base plate having a second cavity, and a mount for securing the work piece in the second cavity,
        wherein when the cover plate assembly and the base plate assembly come together, the rotatable cover plate couples to the rotatable base plate so that the first cavity and the second cavity form a rotatable chamber with the work piece enclosed therein, and the first cavity is positioned above the work piece a manner that enables the gaseous component from the dispensed coating liquid to pass trough the first cavity and subsequently through the opening.

* * * * *

UNITED STATES PATENT AND TRADEMARK OFFICE
CERTIFICATE OF CORRECTION

PATENT NO. : 6,616,758 B2
DATED : September 9, 2003
INVENTOR(S) : Hung et al.

It is certified that error appears in the above-identified patent and that said Letters Patent is hereby corrected as shown below:

Column 7,
Line 30, "cavity. The vent including a exhaust manifold" should read -- cavity, the vent including an exhaust manifold --.

Column 8,
Lines 3 and 14, after "An" insert -- apparatus --.
Line 51, before "a manner" insert -- in --.
Line 52, "trough" should read -- through --.

Signed and Sealed this

Twenty-first Day of October, 2003

JAMES E. ROGAN
*Director of the United States Patent and Trademark Office*

UNITED STATES PATENT AND TRADEMARK OFFICE
CERTIFICATE OF CORRECTION

PATENT NO.    : 6,616,758 B2
DATED         : September 9, 2003
INVENTOR(S)   : Hung et al.

It is certified that error appears in the above-identified patent and that said Letters Patent is hereby corrected as shown below:

<u>Title page,</u>
Item [30], Foreign Application Priority Data, "200101843" should read
-- 200101843-1 --.

Signed and Sealed this

Sixteenth Day of March, 2004

JAMES E. ROGAN
*Director of the United States Patent and Trademark Office*